United States Patent [19]

Matick et al.

[11] Patent Number: 4,577,293
[45] Date of Patent: Mar. 18, 1986

[54] DISTRIBUTED, ON-CHIP CACHE

[75] Inventors: Richard E. Matick, Peekskill; Daniel T. Ling, Croton-on-Hudson, both of N.Y.

[73] Assignee: International Business Machines Corporation, Armonk, N.Y.

[21] Appl. No.: 616,046

[22] Filed: Jun. 1, 1984

[51] Int. Cl.[4] ............................................. G11C 7/00
[52] U.S. Cl. .................................... 365/189; 365/230
[58] Field of Search ................ 365/189, 230, 233, 49

[56]  References Cited
U.S. PATENT DOCUMENTS 4,183,095  1/1980  Ward .................................. 365/189
4,382,278  5/1983  Appelt ........................... 365/189 X Primary Examiner—Joseph A. Popek
Attorney, Agent, or Firm—George E. Clark; Thomas P. Dowd

[57] ABSTRACT

The cache reload time in small computer systems is improved by using a distributed cache located on the memory chips. The large bandwidth between the main memory and cache is the usual on-chip interconnecting lines which avoids pin input/output problems. This distributed cache is achieved by the use of communicating random access memory chips of the type incorporating a primary port (10) and a secondary port (14). Ideally, the primary and secondary ports can run totally independently of each other. The primary port functions as in a typical dynamic random access memory and is the usual input/output path for the memory chips. The secondary port, which provides the distributed cache, makes use of a separate master/slave row buffer (15) which is normally isolated from the sense amplifier/latches. Once this master/slave row buffer is loaded, it can be accessed very fast, and the large bandwidth between the main memory array and the on-chip row buffer provides a very fast reload time for a cache miss.

9 Claims, 8 Drawing Figures

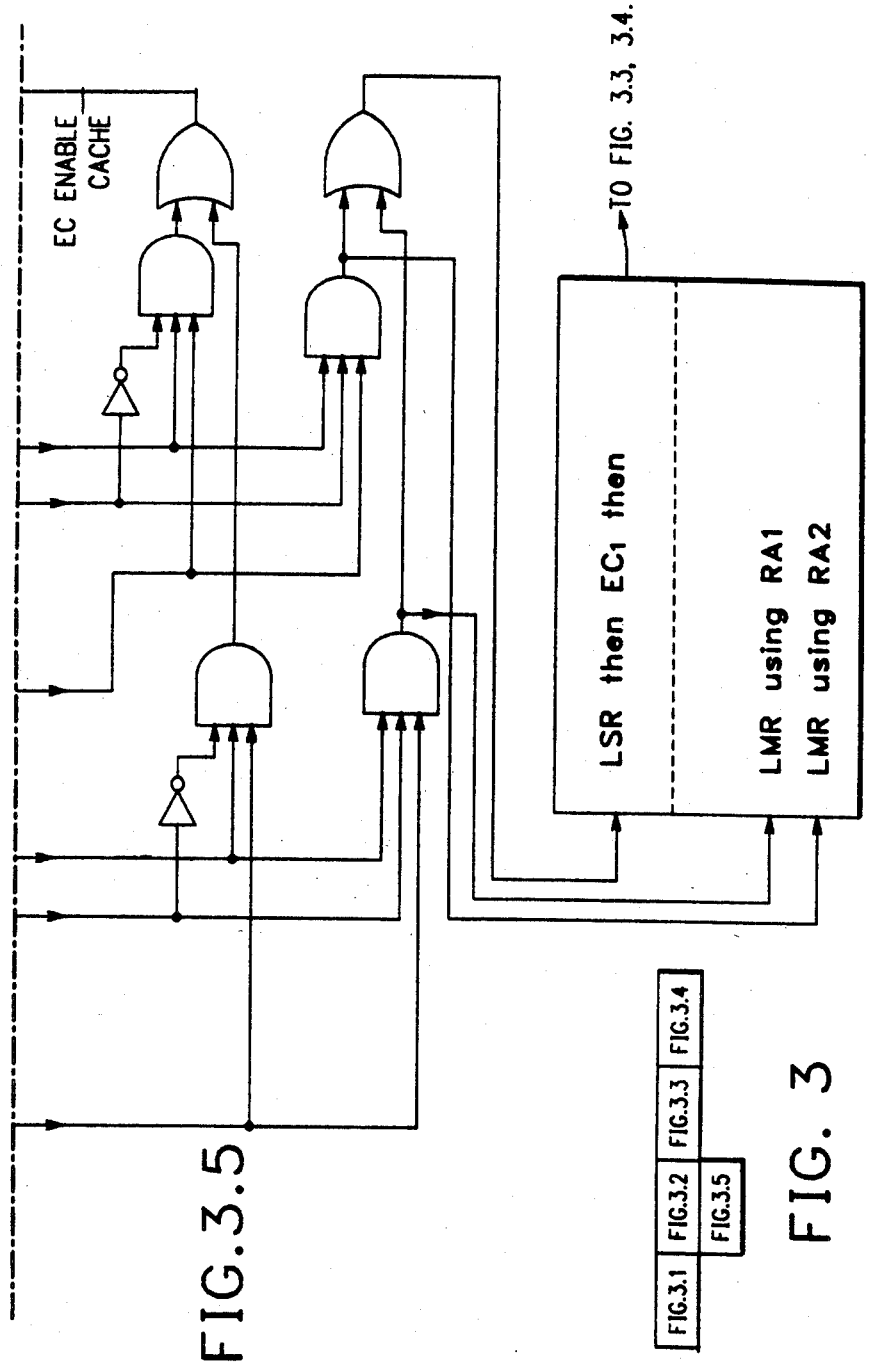

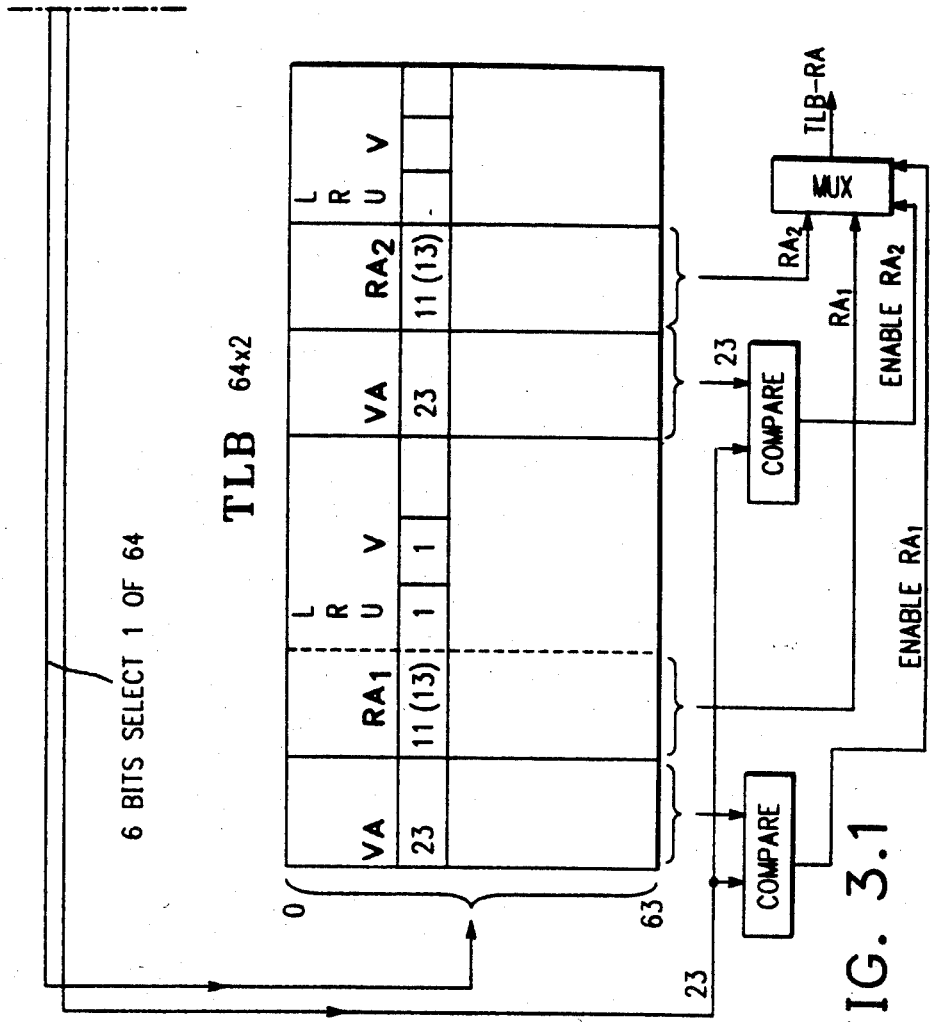
FIG. 3.1

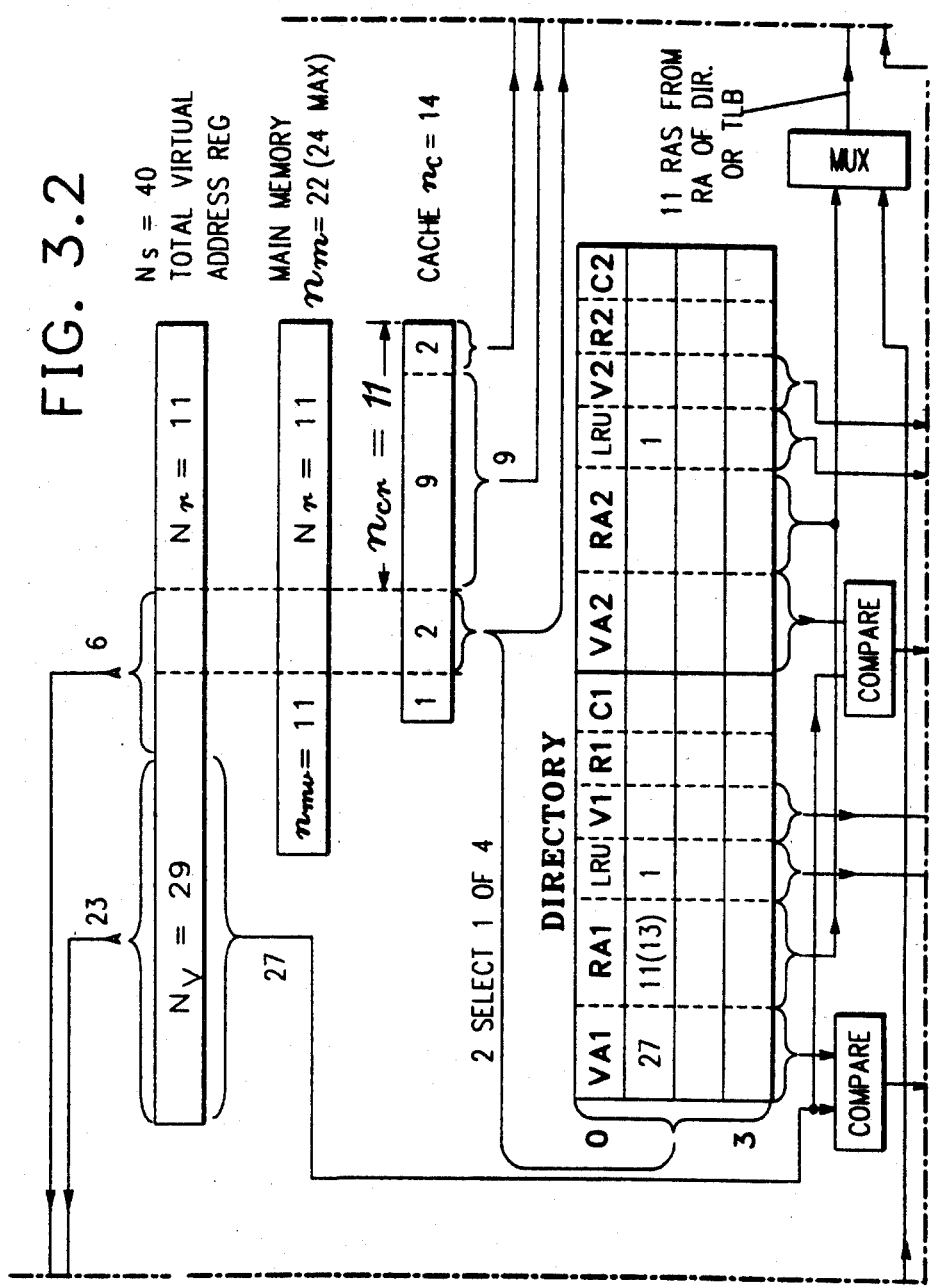
FIG. 3.2

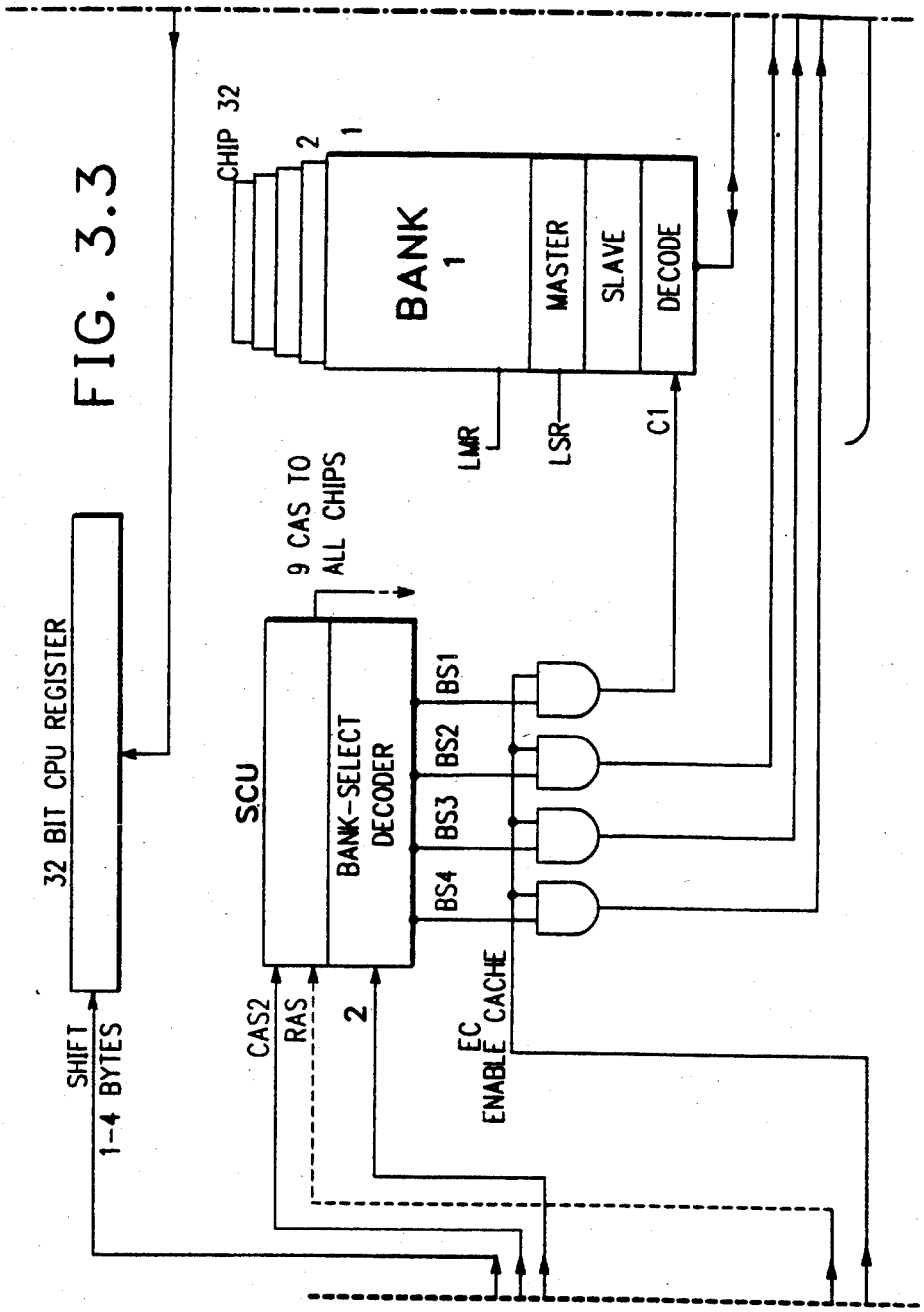
FIG. 3.3

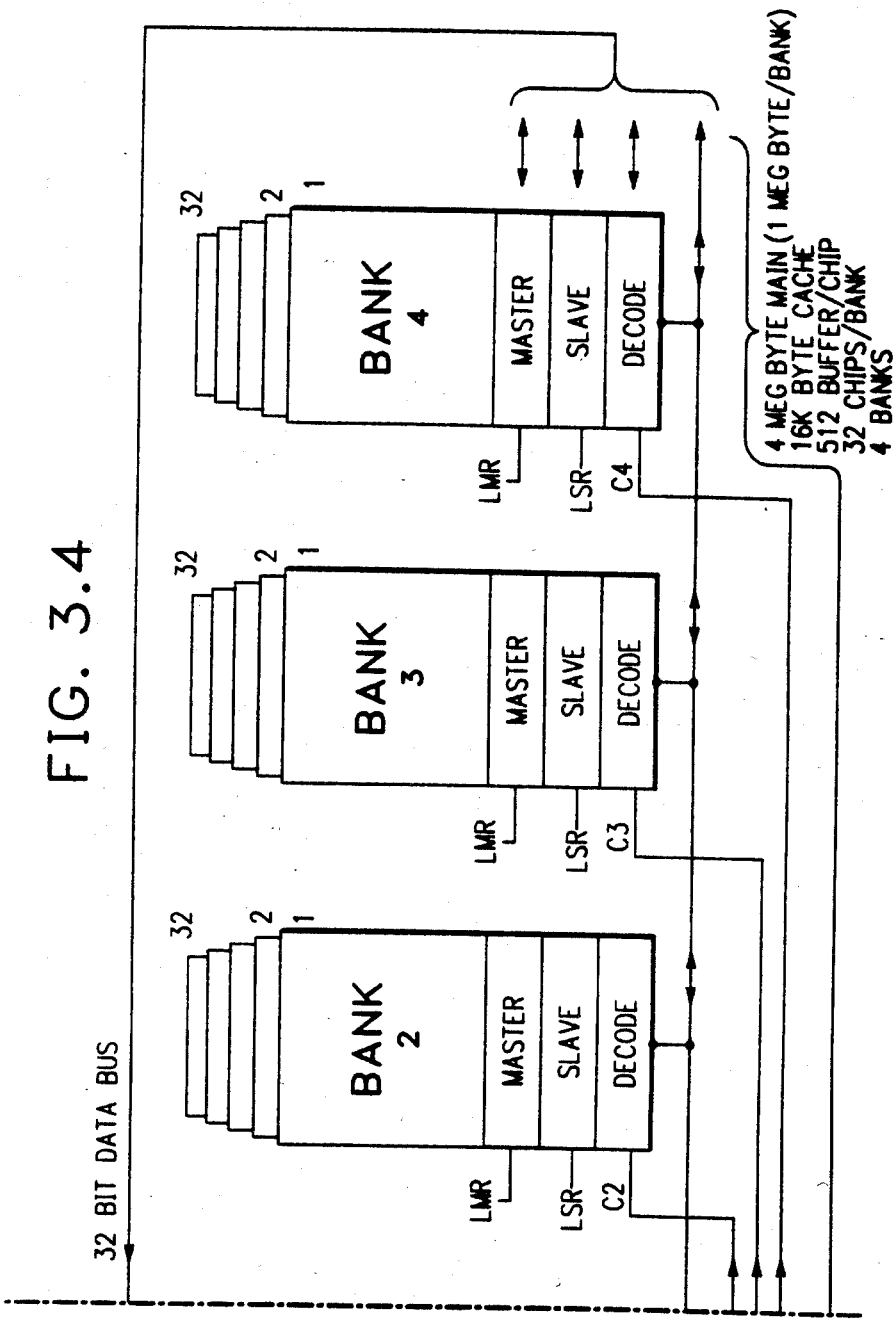
FIG. 3.4

DISTRIBUTED, ON-CHIP CACHE

RELATED APPLICATION

This application is related in subject matter to U.S. patent application Ser. No. 06/616,045 filed concurrently herewith by Paul W. Chung, Richard E. Matick and Daniel T. Ling for "Dynamic Row Buffer Circuit for DRAM" and assigned to a common assignee herewith. The subject matter of that application is incorporated herein by reference. This invention is also related in subject matter to the invention disclosed in an application entitled "Random Access Memory Having a Second Input/Output Port", Ser. No. 06/393,996 filed June 30, 1982, by F. H. Dill, now U.S. Pat. No. 4,541,071.

BACKGROUND OF THE INVENTION

The present invention is generally related to cache memory for central processing units (CPUs) and, more particularly, to the use of cache memory in small computing systems without the significant performance difficulties resulting from the very limited bandwidth normally available to reload the cache from main memory on a cache miss.

The use of a cache for performance improvements on large computing systems is well known and extensively used. In a computing systems, large and small, which make use of cache, one of the major limitations on system performance is the time required to load a block into cache from main memory on a cache miss. Large systems attempt to minimize this time by the use of very large, but otherwise ordinary, bus width between main memory and cache and complex "Latin Square" mapping for a "late select" cache to allow multiple writing into the cache array. This improves the width of the data path. The speed is improved by interleaving of several (e.g. four to sixteen) memory modules.

Small systems usually cannot afford such large busses, complex mapping, or large number of memory modules, and thus must seek other solutions. The major, fundamental requirement on the cache is to provide a moderately small (32 to 64 bit) but very fast (at CPU cycle time) data path between cache and the processor and a very wide (block size) but only moderately fast (at main memory access time) data path between cache and main memory. When cache is a separate physical entity constructed from only few high speed array chips, the bus width between cache and main memory is severely limited by the small signal pin count available on the cache chips. For instance, using a 64K-bit static FET-RAM chip, two such chips give a 16K-byte cache, and the 128K-bit per chip version gives a 32K-byte cache on two chips. If a block size of 64 bytes (512 bits) is used, a data path of 512 lines would be desirable between main memory and cache, or for the least restrictive organization, 256 data pins per chip. It is currently not possible to provide this number of pins, a number like 16 or 32 being more likely. Because of this, the cache reload time is becoming a significant problem in many small, high performance systems.

In U.S. Pat. No. 4,382,278 issued to Daren R. Appelt, a computer system is proposed in which a plurality of registers and at least one workspace is provided in main memory. In addition, there is a workspace cache memory made up of registers within the CPU. Those registers correspond to the registers in the workspace in the main memory. Computer operations are implemented using the contents of the workspace cache registers whose contents are transmitted to the corresponding registers in the workspace of the main memory in the event of a context switch. The architecture of this workspace system achieves high speed register-to-register operations and high speed switching.

A high density memory system comprising a plurality of memory array boards, each having two memory chip arrays, is disclosed by William P. Ward in U.S. Pat. No. 4,183,095. The chip arrays are comprised of 576 memory elements, such as charge coupled devices (CCDs) or other such devices, with each of the memory elements having a 256K bit storage density. A function driver and buffer circuit is operatively associated with a corresponding memory chip array. Ward does not however, teach the use of the buffer circuits as a distributed associative cache.

The present invention is advantageously used with dynamic random access memory (DRAM) chips, and U.S. Pat. No. 3,969,706 issued to Robert J. Proebsting and Robert S. Green discloses an example of a DRAM chip. More specifically, this patent discloses a MISFET dynamic RAM chip wherein information from an address row are read and transferred to a column register. One bit in the column register is then selected by the column address decoder so that data is transferred from that bit to a data output latch. Upon completion of the row address strobe cycle, each cell in the address row is automatically refreshed by the data in the respective bit positions of the column register.

SUMMARY OF THE INVENTION

It is an object of the present invention to provide a cache memory for small computer systems without the need for large busses, complex mapping or large number of memory modules yet logically looks like an ordinary cache in most respects.

According to the invention, the cache reload time is improved by using a distributed cache which is located on the memory chips. The large bandwidth between the main memory and cache is the usual on-chip interconnecting lines which avoids the pin input/output problems. This distributed cache is achieved by use of communicating random access memory chips of the type incorporating a primary and a secondary port. Ideally, the primary and secondary ports can run totally independently of each other. While this is not essential, it is desirable for optimum performance. The primary port functions as in a typical DRAM and is the usual input/output path for the memory chips. The secondary port, which provides the distributed cache according to the invention, makes use of a separate master/slave row buffer which is normally isolated from the sense amplifier/latches. Once this master/slave row buffer is loaded, it can be accessed very fast. Moreover, the large bandwidth between the main memory array and the on-chip row buffer provides a very fast reload time for a cache (row buffer) miss.

BRIEF DESCRIPTION OF THE DRAWINGS

The foregoing and other objects, aspects and advantages of the invention will be better understood from the following detailed description of the invention with reference to the drawings, in which:

FIG. 3, which is comprised of FIGS. 3.1 to 3.5, is a block diagram showing the basic concepts of the invention for a distributed cache on dynamic RAM chips using master/slave synchronous buffer as a two-way set associative cache.

DETAILED DESCRIPTION OF THE INVENTION

Figure 1:
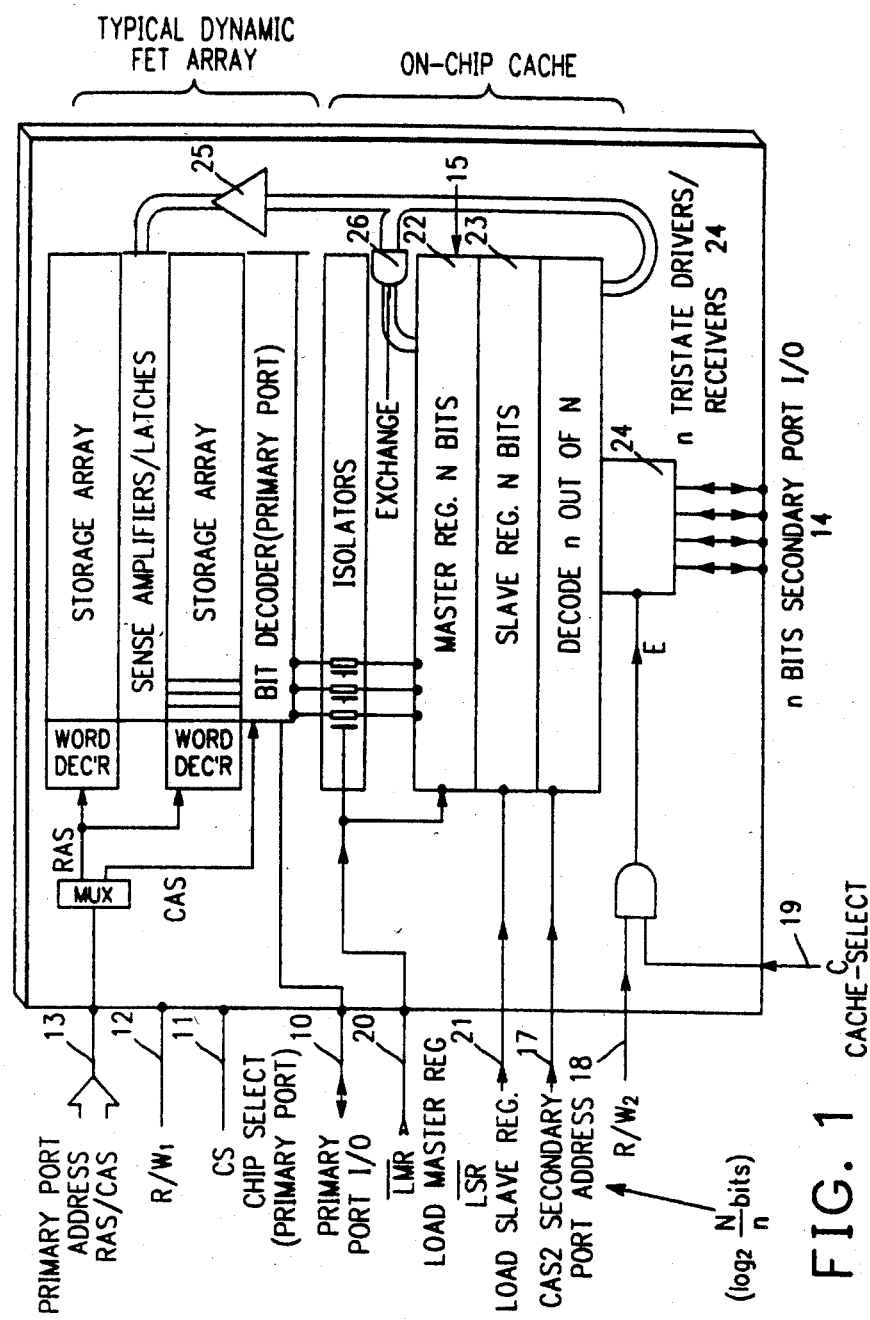
FIG. 1 is a schematic of a dynamic memory chip with an on-chip cache according to the invention.

Turning now to the drawings, and more particularly to FIG. 1, there is schematically illustrated a communicating random access memory chip similar to the type described in more detail in the above-referenced U.S. patent application Ser. No. 06/616.045 filed by Paul W. Chung, Richard E. Matick and Daniel T. Ling with the additional feature that accessing the slave portion of the row buffer is via a decoder rather than serial shifting. The primary port 10 is illustrated in the upper portion of FIG. 1. The primary port address is provided by the RAS/CAS address lines 13 which are multiplexed over the same pins as shown. The primary port 10 is the usual input/output path for the chips and can be one or several, e.g. 16, bits wide. It is selected by the chip-select signal, CS, at pin 11 in combination with a primary read/write signal, R/W1, at pin 12 in the usual manner. The secondary port 14, which provides the distributed cache according to the present invention, is illustrated on the bottom portion of FIG. 1. The distributed cache makes use of a separate master/slave row buffer 15 which is normally isolated from the sense amplifier/latches by the FET isolator switches 16. The master/slave row buffer 15 comprises a master register 22 and a slave register 23 each N bits wide corresponding to the width of the storage array and each composed of master/slave latches according to the teaching of the Chung et al application Ser. No. 06/616.045. The use of master/slave latches in each of the master and slave registers makes it possible for the simultaneous exchange of data between these two registers. In other words, the slave latches of the slave register 23 are connected by means of gates 26 to the master latches of the master register so that as the data in the slave latches of the master register is transferred to the master latches of the slave register in response to a LSR signal, the data in the slave latches of the slave register can be simultaneously transferred to the master latches of the master register. This "exchange" operation can simplify the operation of the distributed cache as will be explained in more detail hereinafter. Connected to the output of the slave register 23 is an n out of N decoder where n is less than N. The decoder is bidirectional and is in turn connected to n tri-state drivers and n tri-state receivers 24. The output port 14 of the buffer is a bidirectional tri-state driven bus which is fully decoded from N bits in the buffer to n bits input/output. Thus, n bits can be read from, or written to, the buffer at a position specified by the CAS2 address on pins 17 in combination with a separate read/write signal, R/W2, on pin 18 and a cache select signal, C, on pin 19. If the cache select signal C is valid, then the cache buffer secondary port 14 is read or written according to the R/W2 signal and the CAS2 address. If CS is valid and C is invalid, then normal memory operation takes place via the primary port only.

To load the cache buffer 15, the chip operates very much in the manner described in the Chung et al application Ser. No. 06/616.045. The RAS addresses are valid as well as load master register, $\overline{\text{LMR}}$, signal on pin 20 and primary read signal, R1, when the chip select signal is applied. This will latch the selected row in the sense latches as well as the master part of the buffer. Subsequently, the $\overline{\text{LMR}}$ is made invalid, thereby isolating the buffer from the normal operation of the memory and the load slave register, LSR, signal on pin 21 is made to load the slave. Once loaded, the buffer can be accessed very fast with only a CAS2 address and C signal. The RAS delay through the memory is avoided. Thus, the buffer provides a distributed cache which has very fast access time to data residing in the row buffer and also has a very fast reload time for a cache (row buffer) miss.

The large bandwidth between the main memory array and the on-chip row buffer is the essential element providing fast reload for this distributed cache. Before describing such a cache in more detail, some advantages over an ordinary "page" or ripple mode type of dynamic memory chip should be noted. First, the refreshing of the dynamic FET chip requires the use of 256 sense amplifiers. Since the row buffer is isolated from the sense amplifier latches, the chip refreshing can take place without destroying the information in the row buffer cache. Furthermore, the completely independent primary port can be used to considerable advantage during a page fault. A page fault causes a task switch to some other user or problem and a page reload from disk (I/O). The new task can be started with a maximum of one memory access to load the cache and with no memory delay if the second task is already in the cache. The new task execution can continue via the secondary port of the row buffer while the page fault can be loaded via the primary port.

It is also possible to write back to main memory by providing drivers connected between the slave register outputs and the sense amplifiers in the memory array. This is shown in FIG. 1 by N parallel driver amplifiers 26 which overpower the sense amplifiers to write the contents of the slave register into the row addressed in the memory array by the RAS address at pins 13.

There are other significant advantages to the use of the row buffer as cache. The row buffer consists of a master/slave register. The master can be loaded at any time by the use of the independent $\overline{\text{LMR}}$ signal. This data remains valid in the master and is latched into the slave only when the LSR signal is issued. The slaves on the various banks will normally be loaded with the desired working set blocks being accessed by the CPU. Eventually, another block will be requested on that bank. Then new blocks will be loaded into the slave portion of the row buffer (output port) and accessed in a normal manner. Subsequently, on a free memory cycle, the previously used block on that bank can be reloaded into the master portion of the row buffer. An entry in the directory must be kept for each of these. If that block in the master part of the row buffer is now re-accessed, and $\overline{\text{LSR}}$ signal transfers it from master to slave, then the cycle time needed to load the master is saved. The latter saving is obtained even if a write-back of the slave (cache) to memory is required due to a change in the block. If the block reloaded in the master is not referenced again, but rather some other block, nothing is lost since the master was reloaded on a free memory cycle of which there will be many. This previously reloaded master block is just written-over by a new memory access and LMR signal. Thus, the invention provides opportunities to make good use of otherwise wasted memory bandwidth. This master/slave register 15 provides a way to approximate a two-way set associative cache. In fact, the logical operation of the master/slave row buffer is completely analogous to that of a two-way associative, late-select type of cache organization as will now be described.

Figure 2:
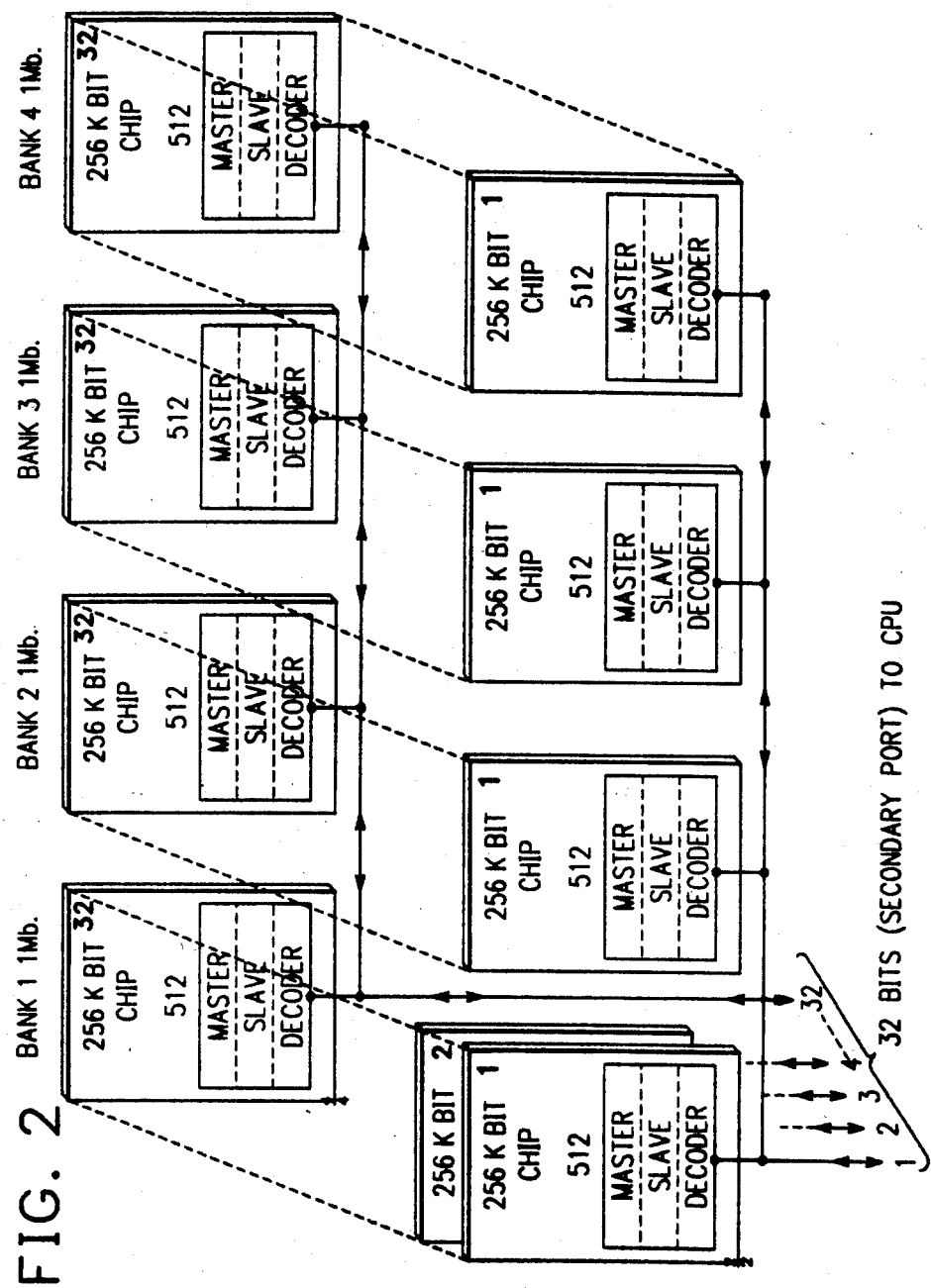
FIG. 2 is a schematic of a four Mbyte main memory consisting of four banks, each having 32 chips with 512 bit on-chip cache.

In order to better understand the distribued cache concept, consider a main memory consisting of a total of 4M-bytes obtained as four banks of 1M-byte each. The memory uses 256K-bit dynamic FET chips with a 1-bit primary port as shown in FIG. 2. In addition, each chip contains a 512 bit cache buffer and a one out of 512 bit decoder on the secondary port. Thus, in the example illustrated, the secondary port is also 1-bit per chip. Each bank has 32 chips so the cache-CPU interface is a 32-bit word. Since the secondary port uses tri-state drivers, all banks can be connected to the same bus as shown. The cache is made up of four pairs of registers, namely the four slave registers plus the four master registers in each bank. Since each register has 512 bits, the four banks of 32 chips per bank give a total cache size of $(512 \times 2) * 4 * 32 = 128K$ bits or 16K-bytes, a rather sizeable cache.

Each master/slave pair of registers on each bank maps one congruence class of the four congruence classes of this two-way set associative cache. Each cache block is $512*32/8 = 2K$ bytes long, and there are a total of eight such blocks, four in each bank of slave registers and four in each bank of master registers. The cache directory, also two-way set associative, must maintain one entry for each of these blocks, hence a 4 by 2 entry directory must be maintained as shown in FIG. 3. There are a number of ways in which the cache and directory can be organized and accessed. For instance, typical caches are accessed in "real" mode, i.e., the address tags in the cache directory are real memory addresses. This use of the real page addresses as tags is done for several reasons. One major reason is that in typical systems it greatly reduces the number of bits which must be stored in the directory. Typical directories can have a total of 4K entries. If the total virtual address of, say, 23 bits is stored rather than the real address of say 13 bits, then an additional 40K bits may be required. However, for the distributed cache, only eight entries are required in the directory so an additional 80 to 100 bits is negligible. The storage of the full virtual address in the directory results in what is called a virtual cache and has distinct advantages. The translation lookaside buffer (TLB) is not normally needed for cache accesses, so the TLB can be used independently to do virtual I/O translation. The TLB is only needed on a cache miss in which case the real address RA obtained from a hit in the TLB is used as the RA which is inserted in the directory at the corresponding set and "least recently used" (LRU) entry. The TLB can have a large number of entries to provide a good hit ratio to the TLB whenever a cache miss occurs.

The LRU bit in the directory serves the usual purpose of specifying which block of the set was least recently accessed. This actually serves two purposes; not only does it indicate which block of the set should be removed when a cache fault occurs, it also specifies whether that block is loaded in the master or slave portion of the cache buffer register. The least recently used block (LRU=1) will be in the master and the most recently used will be in the slave. The block in the slave can be directly accessed with CAS2 through the decoder while the block in the master must first be loaded into the slave via an LSR signal. Subsequently, the block that was in the slave, but removed, is re-loaded into the master using RAS on a free main memory cycle. The chain of events is as follows.

Suppose the four cache slave registers have been loaded with the four most recently used blocks of the current working set. Access to any word in the cache is obtained as follows. A virtual address is provided by the CPU. Two of these bits are used to access one of four sets in the directory and simultaneously decoded to one of four bank select signals BS1 through BS4. This latter decoding can be done in a storage control unit (SCU) as shown in FIG. 3 or directly on the memory card. Either a read or a write, R/W2, signal will be vaild in addition to the CAS2 address, but the latter is not decoded until the cache-select signal, C, is valid. This occurs as follows. The 27 virtual address bits (exclusive of the 2-bit entry-select field) is compared in the directory compare circuits. If a match is obtained on, say, VA1 while the valid V1 is on (entry valid) in the directory of FIG. 3 and if the LRU1 bit is 0 (not least recently used), then this block is in the slave register of that set so an enable cache, EC, signal is generated. This signal is ANDed with the four separate bank-select signals to select the cache of only the correct bank. Note this selection is totally independent of primary port selection and addressing. If the operation was a read cycle, this will enable the secondary port tri-state drivers only on the correct bank. The previously decoded word will now be driven onto the data lines and to the CPU. If the operation was a write cycle, the EC*BS signal will enable the data receiver circuits of the correct bank which sets the new data into the selected word of the cache buffer. The read address RA1 stored in the directory is not needed for this access.

If, on the other hand, a directory compare was successful on, say, VA2 and the LRU2 bit was a 1 (least recently used) and the valid bit is on (valid entry), then this block is in the master portion of the buffer. Since only data residing in the slave is randomly accessible, the data in the master must first be brought into the slave. However, before this is done, if the data in the slave has been changed as signalled by the change bit C1=1 in the directory, then this register must first be written back into memory. Only then can the master be loaded into the slave with a LSR signal and subsequently decoded with CAS2. Alternatively, an "exchange" operation on these registers as previously described would avoid a separate write-back and thereby simplify the operation of the distributed cache. After this operation, the EC*BS signal will become valid and read or write to the current location. In the meantime, the real block address RA1 of the block that was initially in the slave register is saved in the SCU. On a free memory cycle, this block is reloaded into the master part of the buffer. Note that with the proper external controls, this block can be loaded into the master (requires RAS*LMR) simultaneously with accesses to the slave part of the cache buffer.

For the most general case, accesses to the memory chips will sometimes be to the primary port, sometimes to the secondary port, and sometimes simultaneously to both ports with the same or different addresses. This can be done as described above. In special cases where simultaneous access to different banks is not required, it may be possible to eliminate the cache select pin by using a small amount of additional logic on the chip and recognizing that all writes to the primary port can have one of several sequences: RAS and LMR followed by LSR then CAS2; sequence of only CAS2; or LSR followed by CAS2. A simple logic circuit that latches on a RAS signal and resets on an LSR signal or at the end of each cycle would specify primary or secondary access, respectively.

For the particular mapping and organization used in FIG. 3, any given virtual page address predetermines the set that the page and block must reside in for the directory and cache array. This is typical of cache organization. One diffrnece with this organization is that the virtual address also specifies two bits of the real main memory (bank) address, unlike other systems. These two "bank-select" bits can be any of the virtual address bits and should be chosen to scatter the physical allocation of blocks among the four banks at random as much as possible and avoid clustering of blocks to any one bank. It is only necessary that whichever two bits are used for the directory and bank-select address must also be included as part of the TLB address.

This particular distributed cache organization has increased the size of the cache block from typically 32 or 64 bytes to 2K bytes and has reduced the time to reload a block from typically 8 to 16 or more CPU cycles down to one memory cycle (two to four CPU cycles). The block size of 2K bytes is that of the smaller typical page size in the IBM System 370 and equal to some micro-processor page sizes. It is well known that very good hit ratios are obtained for such a page size. It is possible to provide a pseudo distributed cache by using only the standard sense amplifier/latches of a dynamic memory chip such as a commercial ripple-mode chip. Such a chip does not have a master/slave register nor a separate buffer which can be isolated from the remainder of the chip operation. Such a scheme does not lend itself to a two-way set associative organization except with great difficulty. Also, the lack of a buffer with secondary port means that chip refresh will have a significant impact on performance since every refresh cycle will wipe out the entire cache and requires a full start-up reload. Also, with only one port (primary port) into the memory, data cannot be transferred from disks or other places into or out of one memory bank while the pseudo cache (sense latch register) is being accessed.

The scheme according to the present invention not only lends itself readily to a two-way associative orgainzation, but allows refresh to proceed invisibly to the cache accesses. Those skilled in the art will recognize that the basic teaching of the invention of a two-way associative organization can be expanded to an n-way associative cache by the addition of more than one row buffer per chip. Also, data can be transferred from any location over the primary port to not only a different bank than that one being accessed as a cache on the secondary port, but even to the same bank simultaneously. This new organization for a distributed cache thus provides a much better performance in all respects. The chip disclosed in the Chung et al application Ser. No. 06/616,045 contains a 512 bit master/slave buffer, LMR and LSR control signals and secondary port. However, the secondary port is a serial output, sequentially shifted buffer. In order for that chip to be used with this invention, the secondary port, would have to be removed and replaced with a full decoder with tri-state driver. Also, a data path for writing back into the buffer would be necessary. This new chip has some distinct features compared to a simple row buffer. The buffer is isolated from the primary port so that it can run synchronously with the CPU system clock with random access to any bit in the row buffer. This is very unlike the simple row buffer which was designed as a shift register to run asynchronously for slow devices. For the present invention, this cache buffer access time is very fast (on the order of 40ns). The invention permits parallel reload of the cache so that a full cache block can be reloaded in one memory cycle. Normally, this would take multiple memory cycles, and thus a major problem in chache memory management has been solved by the invention. Because very large blocks can be loaded, the size of the cache directory is reduced. Reducing the size of the directory and freeing up the TLB are two more significant advantages of the invention.

We claim:

1. A distributed, on-chip cache comprising a secondary row port buffer on a plurality of dynamic random access memory chips, each of said memory chips comprising a primary port for access to a storage array on the chip, said secondary row port buffer, and isolation means for providing a normally isolated connection between said secondary row port buffer and said storage array, said secondary row port buffer comprising a master register, a slave register, and parallel input/output driver means for providing access to said slave register, said master register being loaded from said storage array through said isolation means and subsequently when said secondary row port buffer is isolated from said storage array by said isolation means, said slave register being loaded from said master register.

2. A distributed, on-chip cache as recited in claim 1 wherein said input/output driver means includes a decoder connected to said slave register for decoding n out of N bits where N is the width of a row in said storage array and N is a number less than N, addressing means connected to said decoder for addressing n bits, and n tri-state drivers connected to said decoder to provide n output bits from said secondary row port buffer.

3. A distributed, on-chip cache as recited in claim 2 wherein said decoder is a bidirectional device, further comprising n tri-state receivers connected to said decoder for reading data into said slave register at a location determined by said addressing means.

4. A distributed, on-chip cache as recited in claim 3 wherein said storage array includes sense amplifiers for sensing the contents of an addressed row of said storage array, further comprising N drivers connected between the outputs of said slave register and said sense amplifiers for writing the contents of said slave register into an addressed row of said storage array.

5. A distributed, on-chip cache as recited in claim 1 wherein each of said master register and said slave register are composed of N master/slave latches where N is the width of a row in said storage array.

6. A distributed, on-chip cache as recited in claim 5 wherein said master/slave latches of said master and slave registers are interconnected to permit the simultaneous exchange of data between said master and slave registers.

7. A distributed, on-chip cache as recited in claim 1 wherein said plurality of dynamic random access memory chips are organized in a plurality of banks of chips, further comprising bank select means connected to each of said banks of chips for addressing a single one of said banks of chips, the output of said cache being the combined output of the secondary row port buffers of each chip in an addressed bank.

8. A distributed, on-chip cache as recited in claim 7 further comprising virtual address register means for storing a virtual address of data, directory means for storing the full virtual addresses of data in said distributed cache, comparing means for comparing the address in said virtual address register means with the addresses in said directory means to generate an enable cache signal if the address stored in the virtual address register means matches an address in said directory means, said bank select means including decoding means responsive to a portion of said virtual address in said virtual address register means to generate a block select signal, and gating means responsive to said enable cache signal and said block select signal to select that portion of the distributed cache containing the data identified by the vitual address in said virtual address register means.

9. A distributed, on-chip cache as recited in claim 8 futher comprising least recently used means in said directory means for determining whether the addressed data is in the master register or the slave register of said secondary row port buffer, and transfer means operative in the event the addressed data is in said master register to first transfer the data from said master register to said slave register before generating said enable cache signal.

* * * * *